United States Patent [19]

Rogovein et al.

[11] Patent Number: 5,511,479
[45] Date of Patent: Apr. 30, 1996

[54] SYSTEM AND METHOD FOR PROVIDING PIN REGISTER HOLES IN FLEXIBLE PRINTING PLATES AND APPARATUS AND METHOD FOR ALIGNING PLATES ON A FLEXOGRAPHIC PRINTING PRESS PLATE CYLINDER

[75] Inventors: Michael E. Rogovein, Overland Park, Kans.; Philip A. Tyrrell, Kansas City, Mo.; Richard Kranz, Leawood, Kans.

[73] Assignee: Tension Envelope Corporation, Kansas City, Mo.

[21] Appl. No.: 266,128

[22] Filed: Jun. 27, 1994

[51] Int. Cl.[6] ....................................................... B41L 3/04
[52] U.S. Cl. ........................................ 101/486; 101/401.1
[58] Field of Search ............................. 101/401.1, 415.1, 101/DIG. 12, 375, 376, 378, 401.3, 486; 33/113, 574, 575; 355/52; 83/452, 453, 462, 464, 465, 466, 466.1, 451

[56] References Cited

U.S. PATENT DOCUMENTS

| | | |
|---|---|---|
| 2,760,273 | 8/1956 | Bregman . |
| 3,368,439 | 2/1968 | Bungay, Jr. . |
| 3,406,629 | 10/1968 | Hoexter ................................. 101/415.1 |
| 3,492,900 | 2/1970 | Hill et al. ................................... 83/464 |
| 3,520,253 | 7/1970 | Head, Jr. . |
| 3,909,329 | 9/1975 | Smolen . |
| 4,380,956 | 4/1983 | Elworthy ............................... 101/401.1 |
| 4,467,722 | 8/1984 | Klingelhoefer et al. . |
| 4,582,768 | 4/1986 | Takeuchi et al. . |
| 4,604,811 | 8/1986 | Roosen . |
| 4,727,806 | 3/1988 | Green, Sr. . |
| 4,829,866 | 5/1989 | Wilson ........................................ 83/451 |
| 4,872,407 | 10/1989 | Banke ................................... 101/401.1 |
| 5,052,120 | 10/1991 | Lubberts . |
| 5,075,980 | 12/1991 | Kerman . |
| 5,189,958 | 3/1993 | Tafel et al. ............................ 101/415.1 |

OTHER PUBLICATIONS

Mosstype, Product Information literature re "Transmount" Carrier System Feb. 3, 1993.

*Primary Examiner*—Eugene H. Eickholt
*Attorney, Agent, or Firm*—Litman, McMahon and Brown

[57] ABSTRACT

A method for accurately drilling pin register holes in flexible printing plates for flexographic printing plate cylinders includes placing aligning pin hole location marks as a part of original artwork used for creating the printing plates. The pin hole location marks are then carried through with each step of developing the flexible plates, including creation of photographic negatives and final type flex negatives from which raised patterns are produced in the finished plates. Pin register holes are then drilled through the finished plate at the marker locations which form a portion of the raised pattern. To align the finished plate on a press, a removable pin register bar is then attached to the plate cylinder, the flexible plate with the register holes drilled therein is placed over the register pins on the bar, the plate is adhered to the plate cylinder in proper printing position and the bar is then removed.

14 Claims, 4 Drawing Sheets

SYSTEM AND METHOD FOR PROVIDING PIN REGISTER HOLES IN FLEXIBLE PRINTING PLATES AND APPARATUS AND METHOD FOR ALIGNING PLATES ON A FLEXOGRAPHIC PRINTING PRESS PLATE CYLINDER

BACKGROUND OF THE INVENTION

1. Field of the Invention

The present invention relates to a system and method for aligning flexible printing plates on flexographic printing press plate cylinders, and, more particularly, to such a system and method in which aligning pin hole locations are marked on original artwork used for creating the printing plates. The pin hole location marks are then carried through with each step of developing the flexible plates and then, only when the final plates are cut to size and ready to be used on a press, pin register holes are drilled through the finished plate at the location marks. A removable pin register clamp is then attached to the press plate cylinder, the flexible plate with the register holes drilled is placed over the register pins on the clamp, the plate is adhered to the plate cylinder and the clamp is then removed.

2. Description of the Related Art

In flexographic printing presses, flexible printing plates with a raised pattern including a design and/or printed message thereon are adhered to a press plate cylinder, which is positioned adjacent to a backup impression cylinder. Printing ink is applied to the raised design on the plate cylinder and paper to be printed is then pulled between the impression cylinder and the plate cylinder, resulting in an inked imprint of the raised design on the paper.

In order for the press to apply the inked design correctly to the paper, the flexible plate must be precisely aligned on the plate cylinder. This is not a problem on litho presses where the printing plates remain the same size for a given press. The same is true for flexographic presses which use a consistent plate size. In these systems, pin register holes can be installed in the plate material when it is manufactured since the pin register holes can be consistently positioned at the edge of the plate material and the plates are always oriented in a single direction on each plate material sheet.

However, in flexographic presses which use varying sizes of press plates, it is important to keep costs down by maximizing the number of plates which can be made from a single sheet of plate material. It is also important to minimize the amount of plate material which is washed away with solvent after each plate is exposed since it is expensive to dispose of the resulting sludge. Thus, to maximize the use of each plate material sheet and to minimize the amount of solvent used in the plate production process, each sheet is often divided into multiple individual plates which are somewhat randomly positioned on the plate material sheet with their orientations often facing in several different directions. This variety of plate sizes and positions on each sheet means that pin register holes must be located at varying locations on the material sheet. This makes it extremely difficult to place pin register holes at the correct locations in the sheet during the creation and development process. Thus, pin register holes are often dispensed within these composite plates, and scribe lines are used instead. The scribe line method requires a trial and error alignment process, as described below.

In flexographic presses which use different sizes of plates on plate cylinders which are not easily removable, alignment is often accomplished via scribe lines on plate cylinder and plate. The limitations of such a method, including parallax problems and the like, result in what is essentially a trial and error method of plate alignment. For example, in envelope manufacturing plants, where runs of envelopes of varying sizes and shapes must be made on the same presses, it is a complex and time consuming process to accurately position printing plates as they are changed between envelope runs. Often, the changing of a single flexible plate on such a press can take a relatively inexperienced press operator several hours. On a four color press, which employs four different plate cylinders for respectively different ink colors, even an experienced press operator will typically take 3–5 hours to change all of the plates. The trial and error plate changing method involves removing each old plate and adhering a new plate to the plate cylinder via a double sided sticky back tape. Typically, the operator will then run the press to print a number of envelopes. The printed envelopes are carefully examined to determine whether the plate positioning is correct and, if not, the plate position is adjusted accordingly. A press run of envelopes will generally total at least 360 and a typical press can print approximately 800–900 envelopes per minute. Thus, each sampling press run of 30 seconds or so can waste upwards of 400 envelopes. It is not unusual for 10 or more trial and error sampling runs to be made for each plate change. Thus, the costs of changing plates on one press, based upon an optimum press down time of 3 hours and consequent production loss of about 150,000 envelopes, as well as the wastage of 2000–4000 envelopes in the trial and error sampling process, can total several hundred dollars or more.

Prior attempts have been made to provide accurate pin register holes in situations where multiple flexible printing plates are created from a single sheet of plate material. Typically, holes are punched in the material at each stage of the plate production, including hole punching of the board as the artwork is created, repunching the holes in the photographic negative made of the artwork, punching holes in a type flex created from a distortion of the negative, and laying out a plurality of individual type flex plates as a composite on the plate material sheet. The pin register holes are then marked on the sheet, the type flexes removed, holes punched in the sheet, and the type flexes are again laid out on the sheet. With each different set of holes punched, the potential for misalignment increases. Furthermore, the requirement for punching holes at each stage of the plate production process adds significantly to the time and cost of plate production.

It is clear, then, that a need exists for a system and method for accurately and efficiently placing pin registration holes in each plate of a composite sheet of flexographic plates. Once such pin registration holes are positioned, an improved system and method is needed for accurately and consistently positioning the plates on a plate cylinder while the plate cylinder is still on the printing press.

SUMMARY OF THE INVENTION

The present invention is directed to a system and method for aligning flexible printing plates on a plate cylinder in a flexographic press. The method includes placing pin register hole location marks on original artwork which serves as the pattern for each printing plate. The pin hole location markings are then photographed as a portion of the artwork to create a first photographic negative. The first negative is then altered in a distortion process which compensates for stretching of the plate when it is installed on a plate cylinder.

The distortion process yields a second negative, commonly called a type flex, which serves as the final pattern for the finished plate. Thus, both the first negative and the type flex negative also have the hole location marks thereon as a portion of the image. Type flex negatives of varying sizes and shapes are then used to layout a flexible sheet of light sensitive polymer plate material to get the optimum yield of plates per sheet. A typical sheet of plate material is 24" by 30" with a light sensitive polymer layer which is 0.067 inches thick overlayed on a thin mylar backing. The sheet of plate material, with the type flexes positioned thereon, is then time exposed to light to degrade the polymer around each type flex negative. The type flex negatives are then removed and the plate material sheet is washed to get rid of the degraded polymer material, the sheet is dried, and then post exposed to harden and set the plate, i.e. convert the remaining polymer material to a stable copolymer. The stabilized plate material sheet is then trimmed to yield individual plates. These individual plates are then placed on a precision drilling machine where they are precisely drilled to place pin register holes at each hole location marking. Once drilled, the finished plates are ready to install on a plate cylinder, as described below.

Each press is equipped with a specially designed plate cylinder which includes a pair of radially aligned bores drilled through the outside surface of the plate cylinder, with the bores positioned near respective ends of the plate cylinder in alignment with the longitudinal axis thereof. Within each bore is positioned a cylindrical sleeve insert extending partially into the bore, with each sleeve including an internal keyway. A pin register V clamp includes an elongate V shaped bar with a pair of bores extending therethrough and spaced the same distance apart as the bores in the plate cylinder. A rotatable spring urged alignment pin is positioned in each bore in the V bar with each alignment pin being sized to fit within a respective one of the sleeve inserts in the plate cylinder. Each alignment pin includes a key designed to fit within the keyway in the respective plate cylinder sleeve insert. The V bar is thus attachable to the plate cylinder by pressing the two alignment pins into the plate cylinder bore sleeves and keyways and then twisting them to lock the keys therein. The V bar is equipped with a series of a plate register pins spaced longitudinally at regular intervals along an outer exposed surface of one leg of the V. The same exposed outer surface includes a groove extending longitudinally along the V bar below the register pins. To attach a desired printing plate to the plate cylinder, since the plate has already been drilled with pin register holes, as described above, an operator positions the plate on the V bar with the pin register holes positioned on the register pins for alignment. The operator then partially adheres the plate to the plate cylinder surface via double sided sticky-back tape and then trims the plate, by running a knife through the groove on the V barn to cut off the pin register hole section. The V bar is then removed from the plate cylinder by unlocking the alignment pins and the plate is fully adhered to the plate cylinder surface, resulting in precise alignment. Instead of the 3–10 hours for an operator to change a flexible plate in the prior art, a complete plate change, using the inventive system and method, can be accomplished by an operator in less than 10 minutes.

OBJECTS AND ADVANTAGES OF THE INVENTION

The principal objects of the present invention include: to provide an improved system and method for aligning flexible printing plates on a printing plate cylinder of a flexographic printing press; to provide such a method in which a pattern of pin register hole location marks is created on the original artwork used to create the printing plate; to provide such a method in which the pin register hole location marks are carried through each step of the plate making process including camera work, type flex, and plate material; to provide such a method in which the pin register hole locations are then precisely drilled to provide pin register holes; to provide such a system and method in which a pin register V clamp is positioned on the plate cylinder; to provide such a system and method in which a finished plate, with the pin register holes drilled therein, is positioned onto the plate cylinder and aligned via the V clamp for accurate alignment on the press, whereupon the V clamp is removed; and to provide such a system and method which is particularly well adapted for its intended purpose.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

I. Pin register Hole Placement Method

Figure 1:
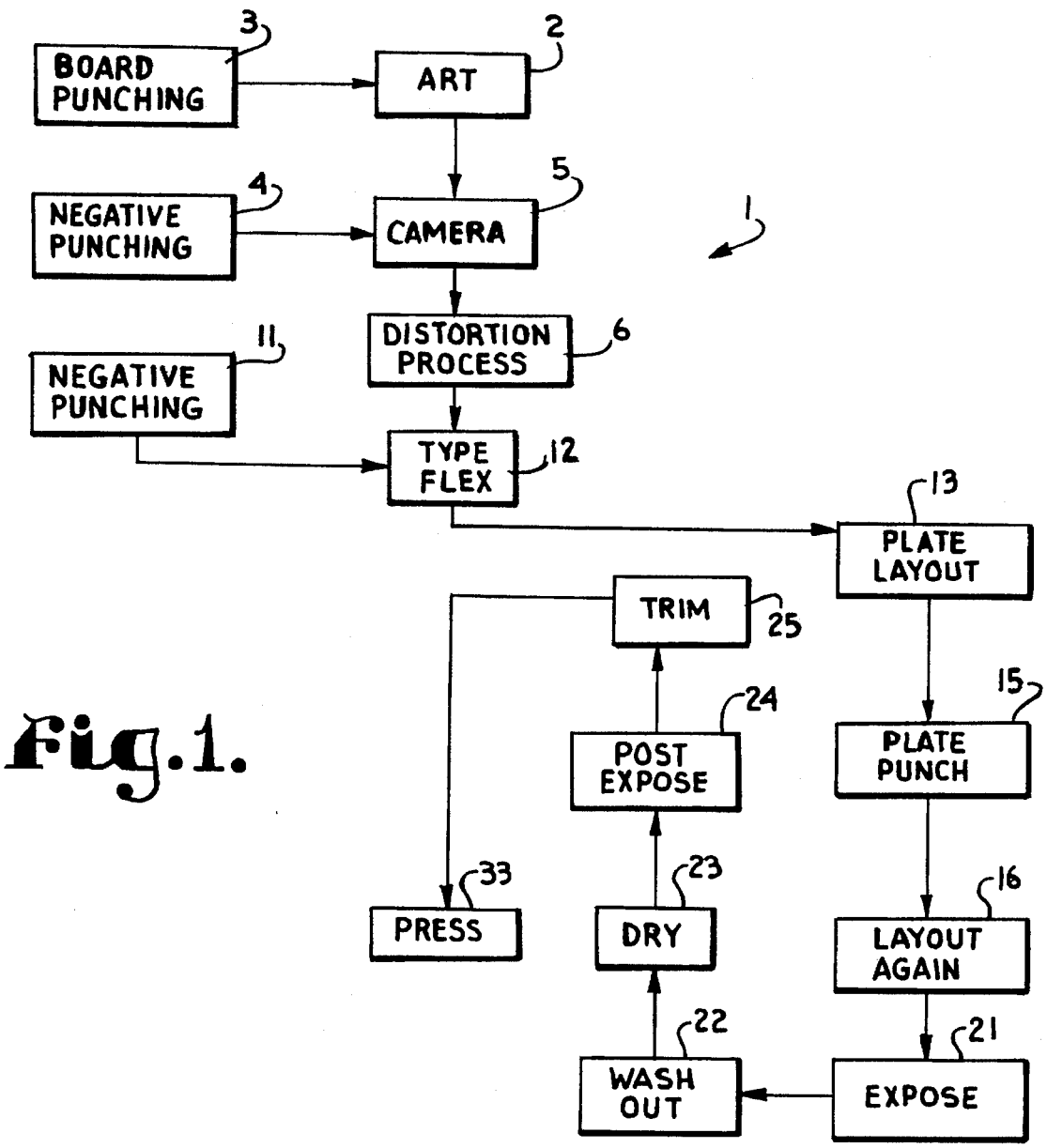
FIG. 1 is a block diagram of a known system of placing pin register holes in multiple flexible printing plates fashioned from a single sheet of plate material.

Referring to FIGS. 1, a block diagram of a known method for providing pin register alignment holes in flexible printing plates for a flexographic printing press is disclosed and generally indicated as 1.

In FIG. 1, block 2 indicates the creation of the original artwork which will be used as a pattern for the flexible printing plate. The artwork is placed on a board, such as bristol board or the like, which, at block 3, is punched with pin register alignment holes which are used to align the artwork board on a stand in a centered position for photographing. At block 4, a first plate of photographic film is punched with holes in the same locations as the holes in the photographed artwork, which holes are used to align the film plate in the camera. At block 5, a picture is taken of the artwork board on the aligned film, from which a first negative is formed. At block 6, the first negative is altered in a distortion process to accommodate for stretching which a flexible plate undergoes when installed on a plate cylinder. At block 11, a second plate of film is punched with pin register holes which allow it to be properly positioned in the camera. At block 12, a second negative is created by photographing the distorted first negative on the second film plate. This second negative, which forms the final pattern for a finished printing plate, is called a type flex. At block 13, a number of type flexes are then laid out on a single sheet of flexible, light sensitive polymer plate material, yielding an arrangement somewhat similar to the sheet 14 shown in FIG. 3. The pin register hole locations from the type flexes are then transferred to the sheet 14 by marking them thereon from the holes in the type flexes and the type flexes are removed. Holes are then punched in the sheet at the hole location markings, at block 15, and the type flexes are again laid out on the sheet 14, and pinned thereto via pins extending through the punched pin register holes, at block 16.

Figure 3:
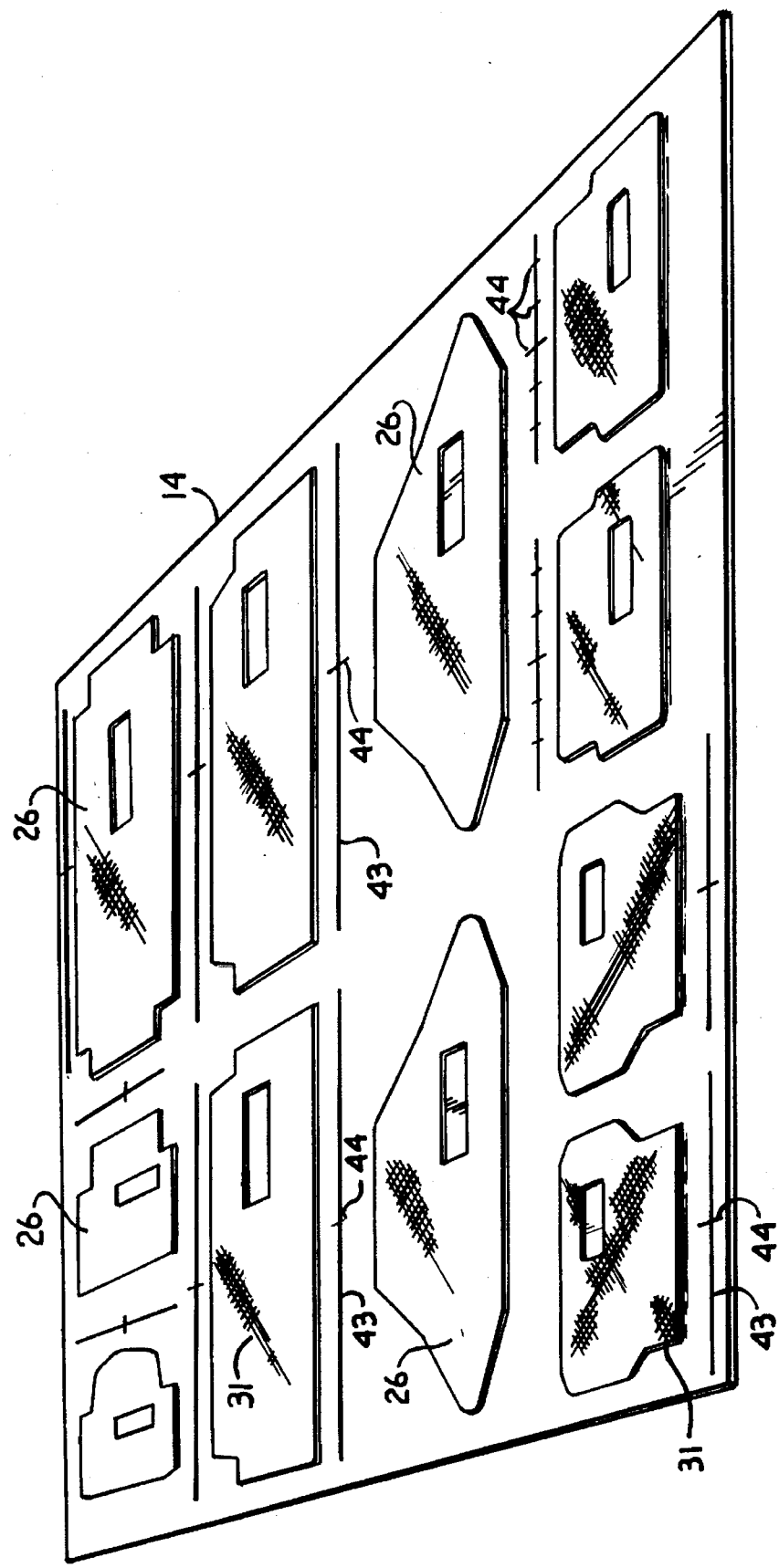
FIG. 3 is a perspective view of a sheet of flexible plate material with multiple plates positioned thereon and with pin register location marks placed on each plate.
Figure 4:
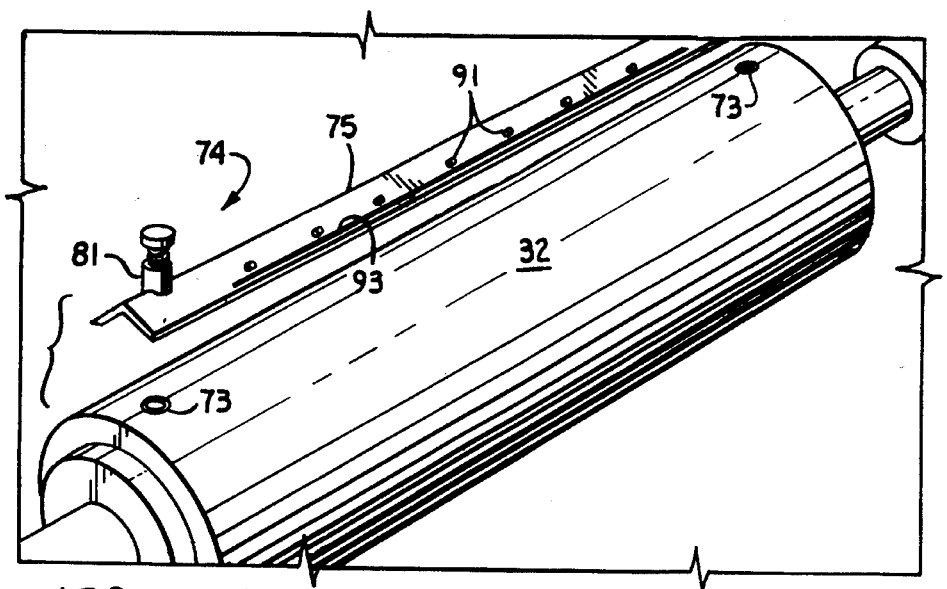
FIG. 4 is a fragmentary, perspective view of a flexographic press and plate cylinder with a pin register V clamp being positioned thereon.

The remaining steps of producing a plurality of plates from the sheet 14 are conventional, but will be described briefly below. At block 21, the sheet 14 is exposed to light of a particular frequency in a timed exposure. Typically a sheet 14 of plate material is sensitive to light of a certain frequency, such as yellow or ultraviolet light, and is approximately 0.067 inches thick overlaid over a thin mylar backing. In the timed exposure step 21, the polymer layer is eroded by the light exposure everywhere except the locations covered by the type flexes. At block 22, the exposed sheet 14 is attached to a drum in a washing apparatus where the sheet 14 is brushed with a solvent to remove the exposed portions of the polymer, leaving a raised pattern where the type flexes were positioned. At block 23, the washed sheet 14 is dried and, in block 24, the dried sheet 14 is post-exposed in a finish curing step to change the light sensitive polymer to a stable co-polymer. At block 25, the cured sheet 14 is trimmed to yield a plurality of plates 26 with raised printing patterns 31, again as shown in FIG. 3. The finished and trimmed plates 26 are then ready for positioning on a plate cylinder, such as the plate cylinder 32 in FIG. 4, as indicated at block 33. Thus, in the known method of FIG. 1, there are a total of five separate method steps, indicated at blocks 3, 4, 11, 15, and 16 which are directly or indirectly attributable to the necessity of providing alignment pin register holes in the final plates 26. In addition to the time and labor involved in these steps, with each new punching of pin register holes, the chances of producing an error in the hole locations increase. Any error in hole location in a finished plate 26 means that the plate 26 will be inaccurately positioned on the plate cylinder 32 and can easily translate into an unacceptable printed product. In summary, the known method of pin register hole placement, as illustrated in FIG. 1, is simply too cumbersome and unreliable to be economically viable.

Figure 2:
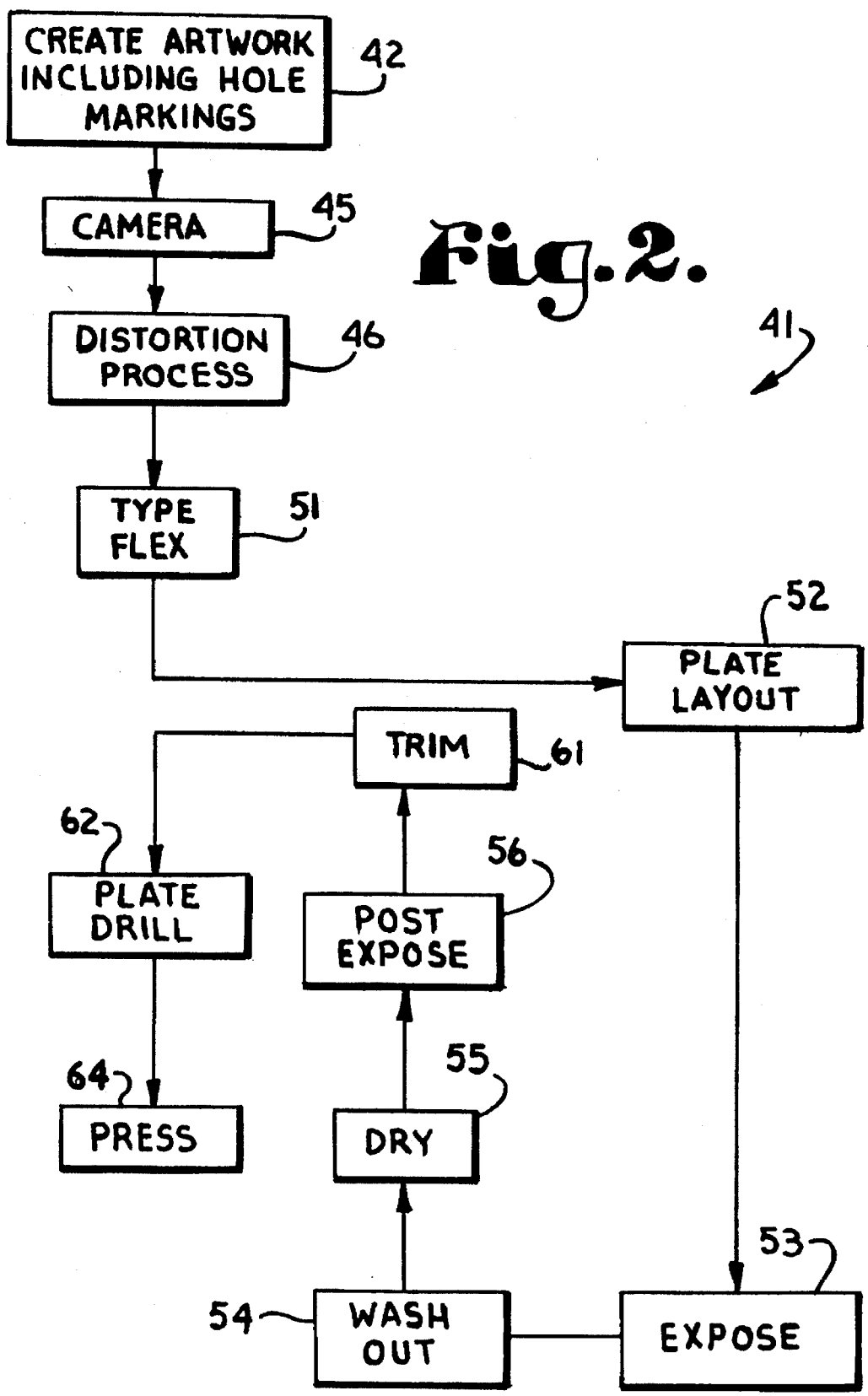
FIG. 2 is a block diagram of the inventive system of placing pin register holes in multiple flexible printing plates fashioned from a single sheet of plate material.

FIG. 2 is a block diagram illustrating the inventive method of providing pin register alignment holes in a composite sheet of plate material, such as the sheet 14 of FIG. 3, with the method generally labeled as 41.

Many of the method steps in the method 41 are the same as steps in the prior art method 1, including block 42, the creation of the basic artwork. However, in block 42, the artwork is created with pin register hole location markings as an integral portion of the artwork. The location markings can take the form of a single line 43, with short, crosshairs 44 at each hole location, as shown in FIG. 3, for example. Typically the hole location crosshairs 44 are either centered on each plate 26 or placed on 2" centers along the line 43. The lines 43 and crosshairs 44 are then carried through the entire method 41, as a portion of the plate pattern and the plate design. Thus, the markings 43 and 44 are photographed at block 45, and carried through the first negative as a portion of the image thereon. At block 46, the first negative is distorted, but still retains the markings 43 and 44. At block 51, the final type flexes are imaged from the distorted first negative, again still retaining the markings 43 and 44 as an integral portion of the photographed image. At block 52, a plurality of type flexes, each including pin register hole markings 43 and 44, are laid out on a sheet of plate material, again such as the sheet 14 in FIG. 3. The sheet 14, with type flexes attached, is exposed, washed, dried, and post exposed, as indicated at blocks 53–56, respectively, to create flexible plates 26 with raised patterns 31. The flexible plates 26 include the lines and crosshairs 43 and 44, respectively, as a portion of the raised pattern 31 thereon.

Figure 5:
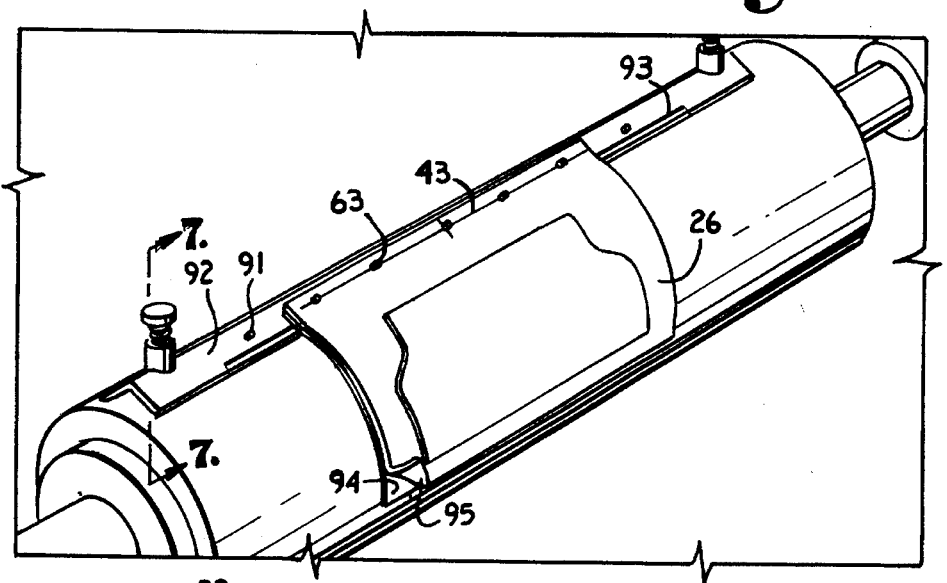
FIG. 5 is a fragmentary, perspective view of the flexographic press and plate cylinder of FIG. 4, with the pin register V clamp positioned thereon and with a flexible printing plate positioned and aligned with the plate cylinder via the register pins and pin register holes.

At block 61, the sheet 14 is trimmed to yield individual plates 26, and, at block 62, each plate 26 is drilled with pin register holes, such as the holes 63 in FIG. 5, in a precision plate drilling apparatus (not shown). At block 64, the plates 26, with the pin register holes 63 drilled therein, are installed on the plate cylinder 32 in a manner described below.

II. Plate Installation Method and Apparatus

Figures 6, 7:
FIG. 6 is a fragmentary, cross-sectional view of the plate cylinder, taken along line 6—6 of FIG. 5 and illustrating an alignment pin inserted into a sleeve in the plate cylinder and with a key on the pin placed in an unlocked position.
FIG. 7 is a fragmentary, cross-sectional view of the plate cylinder, also taken along line 6—6 of FIG. 5 and illustrating the alignment pin inserted into the sleeve in the plate cylinder and with the key on the pin placed in a locked position.

Referring to FIGS. 4–7, a method and apparatus for installing and aligning flexible plates 26 on a printing plate cylinder, such as the plate cylinder 32, is illustrated. The plate cylinder 32 includes a pair of radially aligned bores 71 drilled through the outside surface of the plate cylinder 32, with the bores 71 being positioned near respective ends of the plate cylinder 32. The pair of bores 71 are aligned with each other along the longitudinal axis of the plate cylinder 32. Within each bore 71 is positioned a cylindrical sleeve 72 extending partially into the bore, with each sleeve 72 including a keyway slot 73. A pin register V clamp 74 includes an elongate V shaped bar 75 with a pair of cylindrical supports 81 extending therethrough and spaced the same distance apart as the bores 71 in the plate cylinder 32. A rotatable alignment pin 82 is positioned in each cylindrical sleeve 72 in the V bar 75 with each alignment pin 82 including a larger diameter grip 83 atop the pin 82, with a coil spring 84 surrounding the pin 82 and positioned between the grip 83 and the top of the cylindrical support 81. Each pin 82 also includes a locking key 85 positioned near and extending outward from the bottom thereof. The locking keys 85 are positioned and sized to fit within the respective keyway slots 73. The V bar 75 is thus attachable to the plate cylinder 32 by pressing the two alignment pins 82 into the plate cylinder bores 71 with the keys 85 aligned with the keyway slots 73 and against the action of the springs 84, as shown in FIG. 6. The pin grips 83 are then twisted to misalign the keys 85 and the keyway slots 73, as shown in FIG. 7 to lock them therein and thus to securely lock the V bar 75 into position on the plate cylinder 32, as shown in FIG. 5.

The V bar 75 is equipped with a series of a plate register pins 91 spaced at regular intervals along an outer exposed surface 92 thereof. The V bar 75 also has a groove 93 extending longitudinally along one edge of the surface 92 and positioned below the register pins 91. In order for an operator to attach a desired flexible printing plate 26 to the plate cylinder 32, since the plate 26 has already been drilled with pin register holes 63, as described above, an operator positions the plate 26 on the V bar 75 with the pin register holes 63 positioned on the register pins 91 for alignment. The operator then partially adheres the plate 26 to the plate cylinder 32 surface by peeling one side 94 off of a plate backing of double sided sticky-back tape 95 and partially adhering the plate 26 to the surface of the plate cylinder 32. The operator then trims the plate 26 by running a sharp knife or the like along the groove 93 to cut off a section 96 of the plate 26 which includes the pin register holes 63. The V clamp 74 is then removed from the plate cylinder 32 by twisting the alignment pins 82 to align the keys 85 with the keyways 73. The sticky-backed tape side 94 is then fully peeled and the plate 26 is completely adhered to the surface of the plate cylinder 32, resulting in precise printing alignment. As previously noted, an experienced operator, using the inventive apparatus and method, can change a plate in about 10 minutes or less.

It is to be understood that while certain forms of the present invention have been illustrated and described herein, it is not to be limited to the specific forms or arrangement of parts described and shown.

What is claimed and desired to be secured by Letters Patent is as follows:

1. A method for making a flexible printing plate for installation on a flexographic printing press, comprising the steps of:
   a. placing pin register hole location marks directly on artwork to be incorporated into said printing plate;
   b. creating a type flex negative of the artwork with pin register hole location marks as a portion of an image of said artwork on said negative;
   c. making a finished flexible printing plate from said type flex negative, said finished plate including a raised pattern of said type flex negative, said plate incorporating pin register hole location marks as a portion of said raised pattern; and
   d. drilling pin register holes in said pin register hole location marks in said finished printing plate.

2. A method as in claim 1, wherein said creating step includes:
   a. photographing said artwork to make a first photographic negative of said artwork, said first negative including an image of said pin register hole location marks thereon.

3. A method as in claim 2, wherein said creating step further includes:
   a. distorting said first negative to allow for stretching of said plate upon installation and making said type flex negative from said distorted first negative, said type flex negative including an image of said pin register hole location marks thereon.

4. A method as in claim 1, wherein said making step includes:
   a. laying out a plurality of type flexes on a single sheet of light sensitive plate material, exposing said sheet, with said type flexes attached thereto, to a light source and washing the exposed sheet to yield said raised pattern.

5. A method as in claim 1, and further including the steps of:
   a. installing a finished plate on a flexographic plate cylinder.

6. A method as in claim 5, wherein said installing step includes:
   a. positioning a pin register V clamp, which includes a plurality of register pins, on said plate cylinder;
   b. placing said finished plate on said plate cylinder with the drilled pin register holes placed over respective register pins on said V clamp; and
   c. partially adhering said finished plate to said plate cylinder in a position determined by said register pins.

7. A method as in claim 6, wherein said installing step further includes:
   a. cutting off a portion of said finished plate which includes said pin register holes;
   b. removing said V clamp from said plate cylinder; and
   c. completely adhering the remainder of said finished plate to said plate cylinder.

8. A method of installing a flexible plate on a flexographic plate cylinder, including the steps of:
   a. drilling a plurality of pin register holes in said plate;
   b. positioning a pin register V clamp, which includes a plurality of register pins, on said plate cylinder;
   c. placing said finished plate on said plate cylinder with the drilled pin register holes placed over respective register pins on said V clamp; and
   d. partially adhering said finished plate to said plate cylinder in a position determined by said register pins.

9. A method as in claim 8, wherein said installing step further includes:
   a. cutting off a portion of said finished plate which includes said pin register holes by running a cutting edge through a groove in said V clamp;
   b. removing said V clamp from said plate cylinder; and
   c. completely adhering the remainder of said finished plate to said plate cylinder.

10. A method as in claim 9, wherein said positioning step includes:
    a. inserting a pair of alignment pins on said V clamp into respective receiving bores and keyways in said plate cylinder; and
    b. twisting said alignment pins to lock said V clamp in place.

11. A method as in claim 10, wherein said removing step includes:
    a. twisting said alignment pins to unlock said V clamp; and
    b. removing said pair of alignment pins from said respective receiving bores and keyways in said plate cylinder.

12. A method as in claim 9, wherein said partial and complete adhering steps include:
    a. removing backing from a double-sided sticky back tape on the back of said plate and pressing said tape into contact with said plate cylinder.

13. A method for precisely placing pin register holes in a flexible printing plate, comprising the steps of:
    a. placing pin register hole location marks on artwork as a portion of an image to be used to produce a raised image pattern on said flexible printing plate;

b. creating a photographic image of said artwork including said pin register hole location marks as a portion thereof;

c. making said flexible printing plate from said photographic image of said artwork without punching or drilling said marks in said photographic image, said plate including said raised image pattern with said location marks as a portion thereof; and d. drilling pill register holes in said pin register hole location marks in said printing plate.

14. A method for maximizing the number of flexible printing plates from a sheet of plate material, comprising the steps of:

a. placing pin register hole location marks on artwork as a portion of each of a plurality of images to be used to produce raised image patterns on corresponding ones of said flexible printing plates;

b. photographically creating a type flex of each said image with each type flex also including a photographic record of said pin register hole location marks as an integral portion of an image on the type flex;

c. arranging said type flexes on a sheet of light sensitive plate material to optimize the yield of plates from said sheet;

d. making said flexible printing plates by exposing said sheet of plate material and said type flexes to a light source and washing said sheet to yield said raised patterns with said location marks as a portion thereof; and e. trimming said sheet to yield individual printing plates.

* * * * *